(12) United States Patent
Shirota

(10) Patent No.: US 7,335,035 B2
(45) Date of Patent: Feb. 26, 2008

(54) ELECTRIC JUNCTION BOX

(75) Inventor: Toshiya Shirota, Yokkaichi (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 224 days.

(21) Appl. No.: 11/201,427

(22) Filed: Aug. 11, 2005

(65) Prior Publication Data
US 2006/0040527 A1    Feb. 23, 2006

(30) Foreign Application Priority Data
Aug. 23, 2004    (JP)    ............................. 2004-242029

(51) Int. Cl.
*H01R 12/00*    (2006.01)
(52) U.S. Cl. .................. 439/76.2; 439/949; 439/950; 361/704; 361/707; 165/80.2; 174/16.3
(58) Field of Classification Search .............. 439/76.1, 439/949, 950; 361/641, 704, 707, 715; 165/80.2, 165/80.3, 185; 174/16.3
See application file for complete search history.

(56) References Cited
U.S. PATENT DOCUMENTS

| 6,494,723 | B2* | 12/2002 | Yamane et al. | ............ | 439/76.2 |
| 6,602,079 | B2* | 8/2003 | Chiriku et al. | ............ | 439/76.2 |
| 6,693,370 | B2* | 2/2004 | Yamane et al. | ............ | 307/10.1 |
| 6,785,139 | B2* | 8/2004 | Onizuka et al. | ............ | 361/704 |
| 6,875,028 | B2* | 4/2005 | Kita et al. | ............ | 439/76.2 |
| 6,948,950 | B2* | 9/2005 | Yamaguchi | ............ | 439/76.2 |
| 7,160,118 | B2* | 1/2007 | Shirota | ............ | 439/76.2 |
| 2003/0168432 | A1 | 9/2003 | Onizuka et al. | | |

FOREIGN PATENT DOCUMENTS

| JP | 11-285132 | 10/1999 |
| JP | 2001-319708 | 11/2001 |

OTHER PUBLICATIONS

English language abstract of 2001-319708.
English language abstract of 11-285132.
U.S. Appl. No. 11/183,910 to Shirota, which was filed on Jul. 19, 2005.

* cited by examiner

*Primary Examiner*—Tulsidas C. Patel
*Assistant Examiner*—Harshad C Patel
(74) *Attorney, Agent, or Firm*—Greenblum & Bernstein, P.L.C.

(57) ABSTRACT

An electric junction box includes a circuit construct as an internal circuit component. The circuit construct includes relays mounted on one side of a printed circuit board and bus bars fixed on the other side of the printed circuit board. The circuit construct is divided into a basic standard circuit construct and an optional circuit construct, in which the basic circuit construct is used in a plurality of grades of a vehicle family, in different vehicle families of the same grade, or in all vehicle families. Multiple circuit constructs may be combined as necessary and put in a side by side relationship. On the bus bar side of the circuit constructs, a heat sink is attached such that it is exposed to the opening provided on the case of the electric junction box.

14 Claims, 10 Drawing Sheets

ELECTRIC JUNCTION BOX

BACKGROUND OF THE INVENTION

1. Field of the Invention

The present invention relates to an electric junction box. More specifically, the present invention relates to an electric junction box to be installed in an automobile and includes a power distributor. The power distributor includes a heat sink attached to a circuit construct. The circuit construct includes relays, as well as other electronic components, mounted on one side of a circuit board and bus bars fixed on the other side of the circuit board.

2. Description of Related Art

Conventionally, an electric junction box, such as a junction box for distributing electric power to each of the wire harnesses in an automobile, has a large number of relays and fuses, and a large number of connector-connecting portions formed on the outer surface of the box for connecting bus bar circuits to wire harnesses. The bus bar circuits are contained inside the electric junction box. In recent years, the number of electrical circuits in an automobile has increased in accordance with the sharp increase in the number of electronic components installed in an automobile, particularly as the automobile has become more sophisticated. Therefore, the number of relays mounted in an electric junction box for installation in an automobile has become larger, which in turn has forced the electric junction box to become more dense, as well as larger.

In response thereto, an electric junction box has been provided having a power distributor (PD) built therein. The PD includes semiconductor switching devices (FET) and mounting relays such as SMD relays mounted on a printed circuit board, and a heat sink fixed on the other side of the printed circuit board.

For example, in Japanese Laid Open Patent Publication No. 2001-319708, shown in FIG. 10 of the present application, electric junction box 1 is disclosed, which includes power distributor PD 2 and branch circuit block 5. In PD 2, semiconductor switching device (FET) 3 is mounted on a printed circuit board; a bus bar is fixed on the back-side of the printed circuit board; FET 3, which requires large electrical current, is connected to the bus bar; and heat sink 4 is attached to the bus bar. Branch circuit block 5 is made from the lamination of bus bars and insulation plates. On the lower surface of case 6 of electric junction box 1, connector housings 7 are provided for permitting insertion of connectors of wire harnesses (not shown in the figure) installed in a vehicle. On the upper surface of case 6, fuse housing 8 is provided. Connector housing 7 and fuse housing 8 are connected to branch circuit block 5.

However, as it stands now, PD 2 of electric junction box 1 is designed as an exclusive part for each specific vehicle family by using a single circuit board. When making a design for a new vehicle family or when a design change is required, the design and manufacturing process of PD 2 has to be started anew, thereby causing an additional burden in the design process, as well as increasing production and management costs. In recent years, since space efficiency for installing electric junction box 1 in a vehicle has been a primary concern, a distance between electronic components mounted on PD 2 has become narrower, thereby making it difficult to respond promptly when a design change is required. In particular, the design load has become extremely large when making PD designs for vehicle families with large differences in specifications, and vehicle families with different types of engines, such as, diesel engines and gasoline engines.

In addition, in the electric junction box 1 shown in FIG. 10, since PD 2 is laterally juxtaposed to branch circuit block 5 in a horizontal surface direction, a problem exists in that the installation space required for installing electric junction box 1 in a vehicle becomes large. When PD 2 is laminated on the lower surface of branch circuit block 5 for the purpose of minimizing the horizontal area of electric junction box 1, it puts restrictions on locations for connector housings 7. Since power input and output between a wire harness (not shown in the figure) and PD 2 are done almost completely via branch circuit block 5 from connector housings 7, when designing the arrangement of connectors for each destination, a problem arises in that circuit wirings of PD 2 and branch circuit block 5 become very complicated.

It would be advantageous to simplify the design for an electric junction box having a built-in PD. The present invention is provided to address the above-described problems.

SUMMARY OF THE INVENTION

The objective of the present invention is to provide a configuration that simplifies the design task for an electric junction box having a built-in power distributor (PD).

Accordingly, one object of the present invention is to provide an electric junction box that is suitable for installation in an automobile. The electric junction box includes a circuit construct as an internal circuit component of the electric junction box. The circuit construct includes relays mounted on a first side of a printed circuit board and bus bars fixed on a second side of the printed circuit board. Further, the circuit construct includes a standard circuit construct and an optional circuit construct. The standard circuit construct is configured to be installed in an automobile, regardless of the manufacturer (i.e., make) or model of the automobile. That is, the standard circuit construct may be installed in a plurality of grades of a vehicle family, in different vehicle families of equal grade, or in all vehicle families. Still further, multiple circuit constructs are positioned adjacently, and a heat sink is attached on a side of the circuit constructs having the bus bars, which thus forms a power distributor. Also, the heat sink is attached as to face an opening provided in a case of the electric junction box.

The standard circuit construct may include a circuit construct for a battery side connection and a circuit construct for an alternator side connection, in which the electric junction box is configured to selectively receive the first circuit construct for the battery side connection in a vehicle having a gasoline engine or in a vehicle having a diesel engine.

Another feature of the present invention is to provide an electric junction box that includes a power distributor including a circuit construct having circuit board mounting relays mounted on a first side of a printed circuit board and bus bars mounted on a second side of the printed circuit board. A heat sink is attached on the bus bar side of the circuit construct and the heat sink faces an opening provided in a case of the power distributor. A branch circuit module includes a laminate of bus bars and insulation plates, and includes housings for relays, fuses and connectors, which are connected to the bus bars. The laminate is provided inside the case, and the housings are provided on a side of the case.

The power distributor is arranged perpendicularly to the branch circuit module along an edge on a side of the branch circuit module, forming a generally L-shaped configuration.

Further, the terminal portions of the bus bars of the branch circuit module are provided at a corner of the generally L-shaped configuration, and are welded to the terminal portions of the bus bars of the circuit construct. The bus bars of the circuit construct are provided perpendicularly to the bus bars of the branch circuit module.

The circuit construct may include a standard circuit construct and an optional circuit construct. The standard circuit construct is configured to be installed in an automobile, regardless of the manufacturer (i.e., make) or model of the automobile. Further, the standard circuit construct may include a circuit construct for a battery side connection and a circuit construct for an alternator side connection. The electric junction box is configured to selectively receive the first circuit construct for the battery side connection in a vehicle having a gasoline engine or in a vehicle having a diesel engine. A connector housing may be provided on a first side of the branch circuit module and a relay housing and a fuse housing may be provided on a second side of the branch circuit module.

Another feature of the present invention is to provide an electric junction box that includes a power distributor including a circuit component having a printed circuit board. At least one relay is provided on a first side of the printed circuit board, at least one bus bar is provided on a second side of the printed circuit board, and a heat sink is provided opposite an opening in a case of the power distributor. A branch circuit module formed from a laminate of bus bars and insulation plates is also provided which includes multiple housings for electrical components. The power distributor and the branch circuit module form a generally L-shaped configuration, The bus bars of the branch circuit module include terminal portions connected to terminal portions of the at least one bus bar of the circuit component. The bus bars of the branch circuit module are generally perpendicular to the bus bar of the circuit component. The circuit component may include a first circuit component for a battery side connection and a second circuit component for an alternator side connection.

Further, the electric junction box may be configured to selectively receive the first circuit component for the battery side connection in a vehicle having a gasoline engine or in a vehicle having a diesel engine. A connector housing is provided on a first side of the branch circuit module and a relay housing and a fuse housing are provided on a second side of the branch circuit module.

In the configuration described above, one circuit construct in an electric junction box is not formed as a single-piece structure, but is divided into two parts, i.e., a basic standard circuit construct and an optional circuit construct. The basic standard circuit construct requires no circuit changes across grades of a vehicle family or different vehicle families of the same grade or all vehicle families. The optional circuit construct may or may not be used, or may have a change in the circuit, depending on vehicle family or grade. Therefore, it is sufficient to design only the optional circuit construct when a vehicle family or grade is different, thereby reducing design load. Since the basic standard circuit construct can be used among different vehicle families or grades, production and management costs can be reduced as well.

In other words, by separating the part of the circuit for a battery connection, which is different among a gasoline engine vehicle and a diesel engine vehicle, the basic standard circuit construct is divided into a circuit construct for the battery side connection and a circuit construct for the alternator side connection. The circuit construct for the alternator side connection, which is independent of engine types, can be commoditized. Therefore, when making a PD design according to the engine type, it is sufficient to design only the circuit construct involving a circuit change, thereby making it possible to reduce design load.

In the place of the PD having bus bars fixed on the back side of a printed circuit board, it is also possible to have a configuration, in which a circuit construct having bus bars fixed on an insulation plate is provided, and terminals of the relays for large electric currents that are mounted on the insulation plate are fixed to the bus bars by welding.

In the configuration described above, since the PD, which includes a circuit construct, is placed perpendicularly along the edge on one side of the branch circuit module, which includes a laminate of bus bars and insulation plates, and the overall configuration forms a generally L-shaped configuration, it is possible to reduce the planar area of the electric junction box when it is installed in a vehicle. Further, since the PD does not occupy any space outside the case of the branch circuit module, it enhances the flexibility with respect to choosing a location for the connector housing on the outer surface of the case. Therefore, when making a design for the arrangement of connectors for each destination, circuit wirings of the branch circuit module and relay module become easier.

Since the circuit connection between the branch circuit module and the PD is implemented by welding the ends of the bus bars of the branch circuit module to the ends of the bus bars of the PD, the reliability of the electrical connection is enhanced as compared to connector connection or insulation displacement connection. Further, because of the welding connection, it is not necessary to form insulation displacement connection tabs on the terminal portions of the bus bars of the PD, thereby eliminating restrictions on the elasticity and rigidity of the bus bars. Therefore, the flexibility in the design is enhanced, as various materials such as those with high thermal and electrical conductivity (for example, oxygen-free copper and the like) or inexpensive brass can be selected for the bus bars of the PD.

When a PD is divided, the branch circuit module can be utilized for making electrical connections and splices between the divided circuit constructs, thereby simplifying the circuit wiring of each circuit construct on the PD side. Although the laminate of the branch circuit module includes a plurality of bus bar layers, the PD includes only one bus bar layer. Therefore, having circuit wirings on the PD side is simplified and advantageous for the design.

When a connector attached at the end of a wire harness is inserted into the connector housing, the wire harness stands up from the connector housing. Therefore, there exists no useful empty space immediately above the connector housing of the electric junction box when it is installed in a vehicle. Because of this, the connector housing is formed on the side of the branch circuit module facing the same direction along which the PD is attached perpendicularly to the edge of the branch circuit module. By doing so, since the PD is placed in the space which is already not usable for placing other auto parts due to the standing up of the wire harness when its connector is inserted into the connector housing, attaching the PD perpendicularly to the branch circuit module does not take additional installation space from other auto parts.

As it is clear from the above description, according to the present invention, the circuit construct in an electric junction box is divided into a basic standard circuit construct and an optional circuit construct. Therefore, it is sufficient to design only the optional circuit construct for different vehicle families, for example, thereby reducing design load significantly. Since the basic standard circuit construct can be commoditized, production costs can be reduced as well.

Since the PD, which includes a circuit construct, is attached perpendicularly to the edge on one side of the branch circuit module, which includes a laminate of bus bars and insulation plates, and the overall combination forms a generally L-shaped configuration, it is possible to reduce the planar installation area of the electric junction box when it is installed in a vehicle. Since the flexibility with respect to choosing a location for the connector housing on the outer surface of the case is enhanced, circuit wiring of each module becomes easier. Further, since the circuit connection between the branch circuit module and the PD is implemented by welding the ends of the bus bars of the branch circuit module to the ends of the bus bars of the PD, the reliability of the electrical connection is improved and it also allows more flexibility for selecting a material for the bus bars.

BRIEF DESCRIPTION OF THE DRAWINGS

The above, and other objects, features and advantages of the present invention will be made apparent from the following description of the preferred embodiments, given as nonlimiting examples, with reference to the accompanying drawings in which.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

Figure 1:
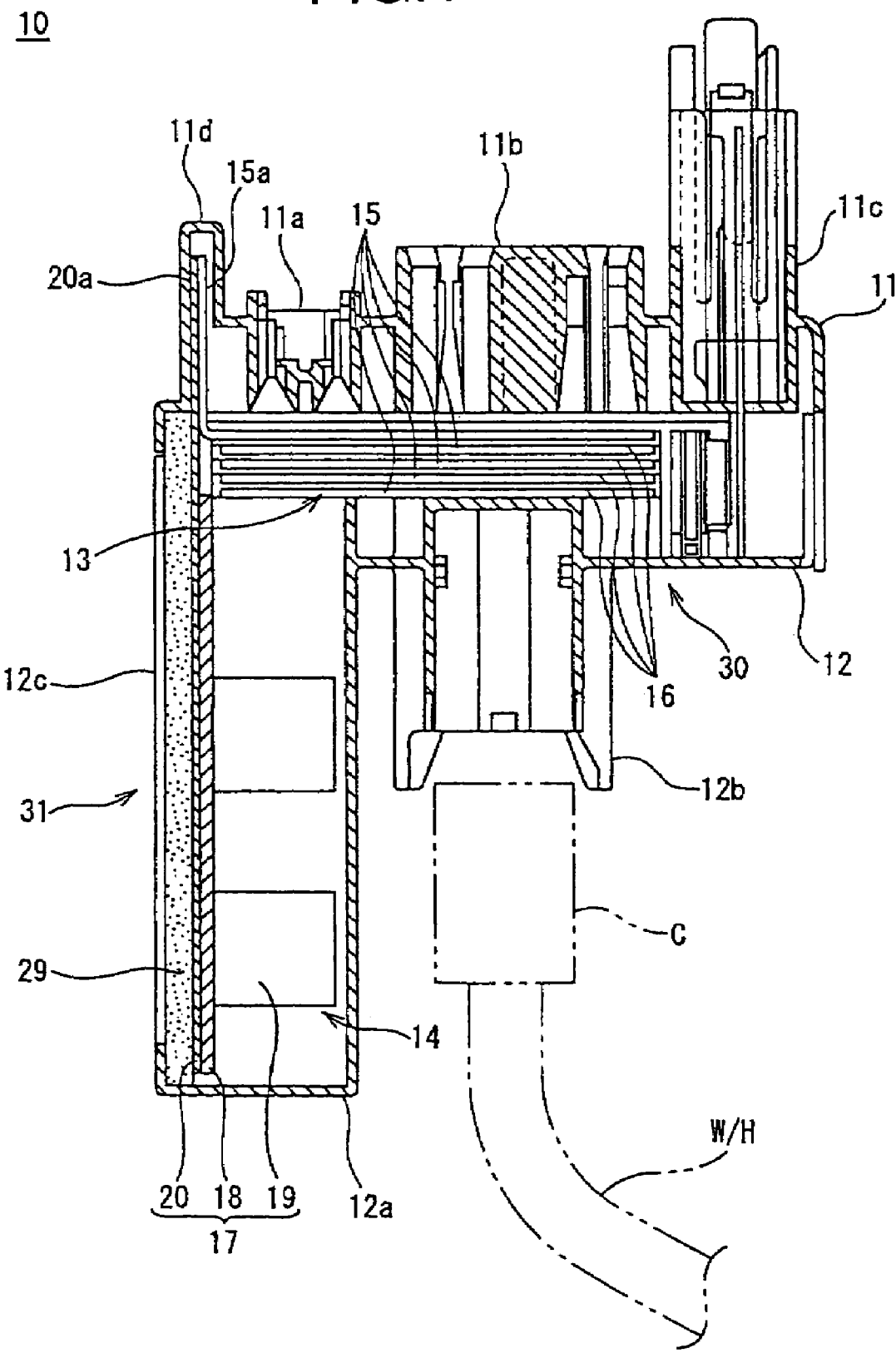
FIG. 1 is a cross-sectional view of an electric junction box, according to a first embodiment of the present invention.
Figure 2:
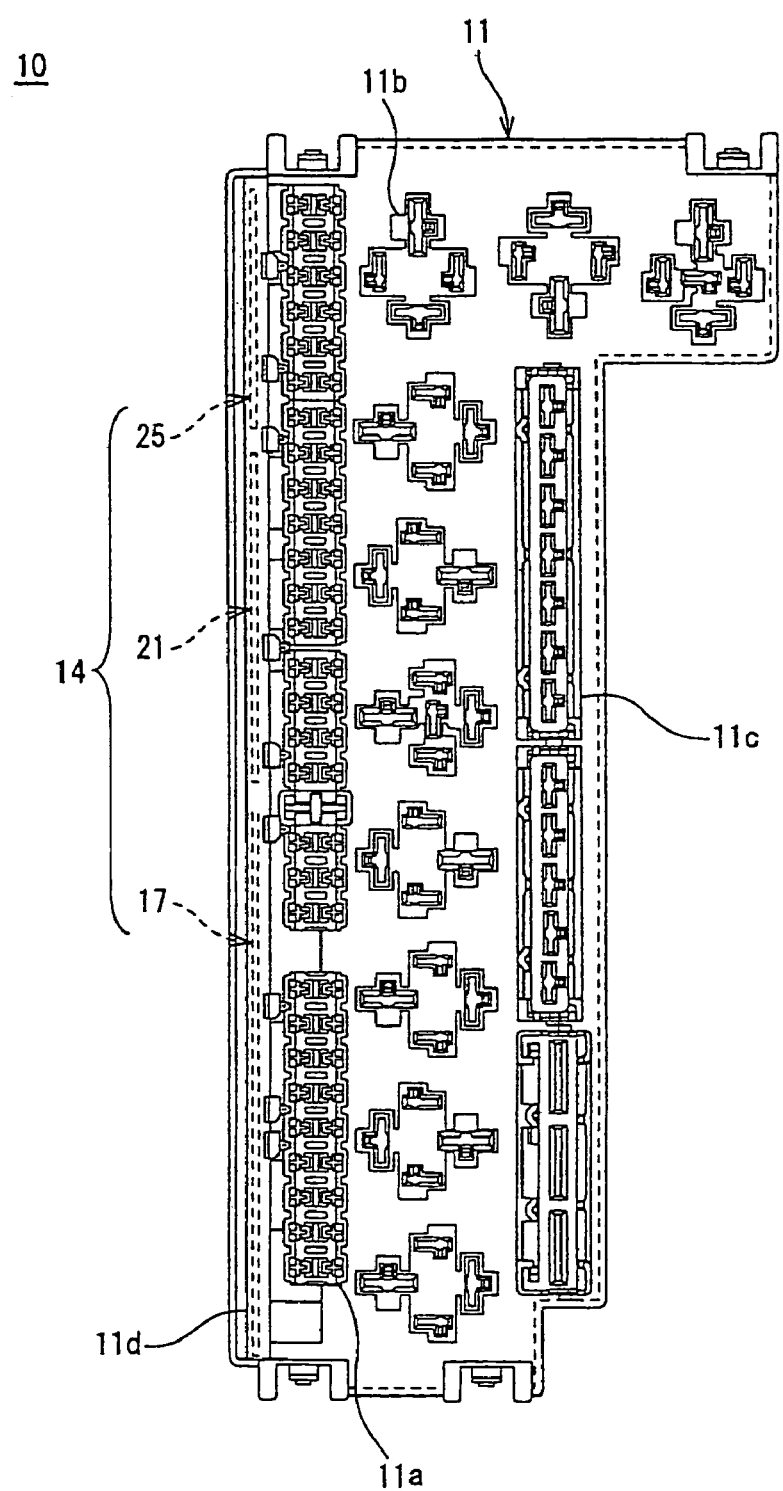
FIG. 2 is a top view of the electric junction box, according to the present invention.

The following describes preferred embodiments of the present invention with reference to the drawings. Electric junction box 10 of the present embodiment is configured for installation in gasoline engine vehicles of high grades. As shown in FIGS. 1 and 2, laminate 13 is placed horizontally between upper case 11 and lower case 12, and serves as branch circuit module 30. Laminate 13 is made from a plurality of bus bars 15 and a plurality of insulation plates 16. In the lower region of one side of the lower case 12, PD housing 12a is provided as an extension along a vertical direction and contains a power distributor (hereafter referred to as PD) 31, which includes circuit construct 14 (e.g., circuit component). As described above and shown, PD 31 is placed perpendicularly downward on one side of branch circuit module 30, thereby making the overall structure of electric junction box 10 generally L-shaped.

Fuse housing 11a, relay housing 11b and fusible link housing 11c are provided on a topside of upper case 11. Further, housing 11d is formed on the topside of upper case 11 in a location where the PD 31 is placed. Housing 11d is provided for the connection between the bus bars of circuit construct 14 and bus bar 15 of branch circuit module 30.

Connector housing 12b is formed on the bottom side of lower case 12 in a location corresponding to where the branch circuit module 30 is placed. Adjacent to connector housing 12b, the PD housing 12a projects downwardly. On the lateral surface of PD housing 12a, opening 12c is formed for the purpose of exposing heat sink 29, which is attached to the circuit construct 14.

The tab of bus bar 15 of branch circuit module 30 projects into the terminal hole of connector housing 12b of the lower case 12, and is connected to the terminal of connector C, which in turn is attached at the end of wire harness W/H.

Figure 3:
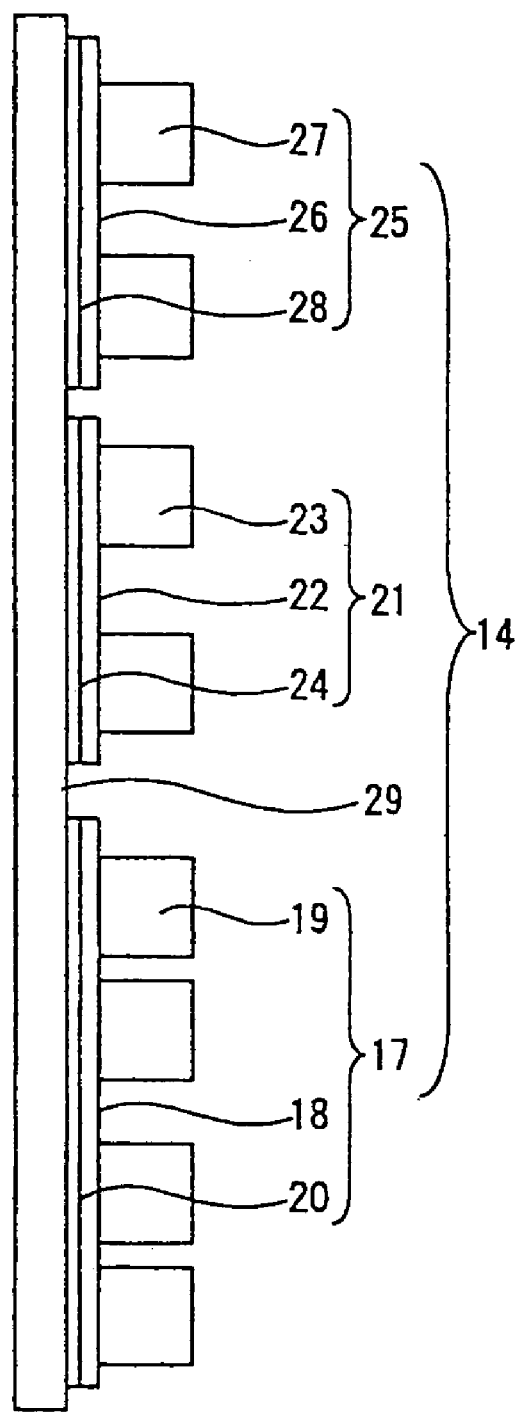
FIG. 3 is a lateral view of the power distributor, according to an aspect of the present invention.

As FIG. 3 shows, circuit construct 14 is divided into 3 types of circuit constructs, i.e., identified by reference numerals 17, 21, and 25. Specifically, circuit construct 17 for a battery side connection and circuit construct 21 for an alternator side connection are basic standard circuit constructs and can be used across all vehicle families. Optional circuit construct 25 is provided for additional specifications.

Circuit construct 17 of the current embodiment is a circuit construct for gasoline engines. The circuit construct for diesel engines is shown in FIG. 5, wherein circuit construct 117 is employed for the battery side connection. In other words, circuit constructs 17 and 117 for the battery side connection are designed separately to be used respectively for gasoline engine vehicles and diesel engine vehicles. (Hereinafter 17 and 117 are also referred to as circuit construct for gasoline engines and circuit construct for diesel engines, respectively.)

Figure 4A:
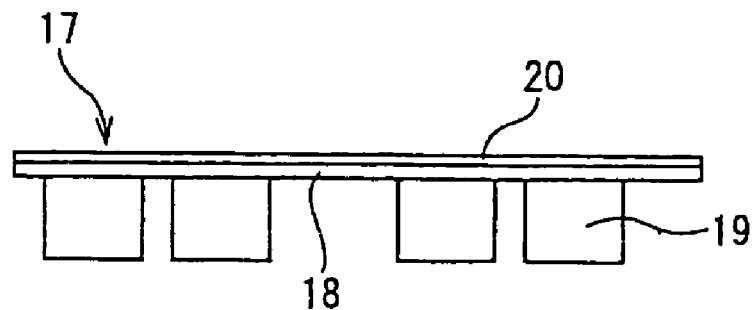
FIG. 4A is a lateral view of a circuit construct for gasoline engines, according to an aspect of the present invention.
Figure 4B:
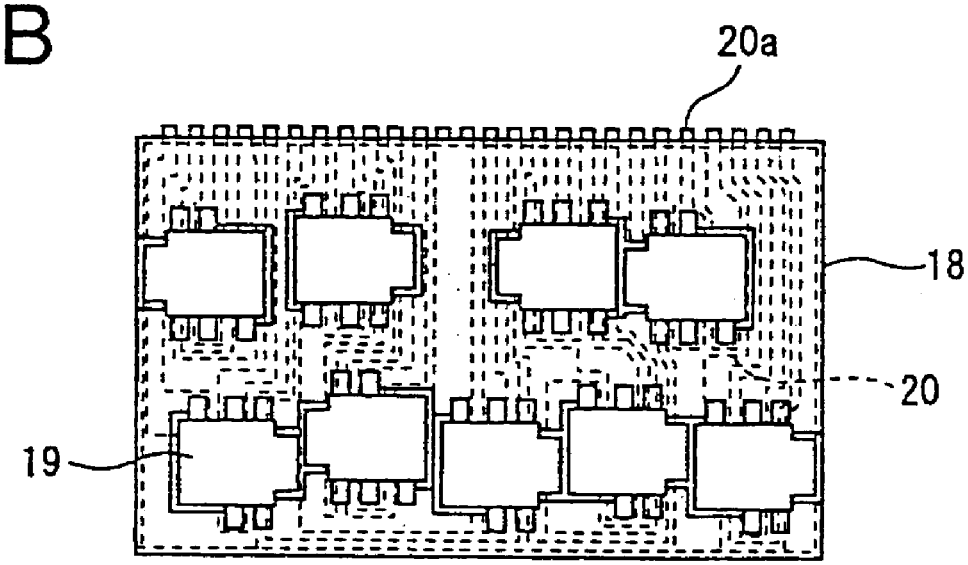
FIG. 4B a top view of the circuit construct for gasoline engines, according to an aspect of the present invention.

As shown in FIGS. 4A and 4B, circuit construct 17 for gasoline engines according to the present embodiment has a relay 19 mounted on one side (the inner side in FIG. 1) of printed circuit board 18 and bus bar 20 fixed on the other side (the outer side in FIG. 1) of printed circuit board 18. Bus bar 20 is stamped out with a predetermined circuit pattern.

The terminal of relay 19 penetrates the insulation plate of printed circuit board 18 and is soldered to bus bar 20 to make an electrical connection therewith.

Terminal portion 20a on one side of bus bar 20 of PD 31 extends upwardly beyond the edge of printed circuit board 18 (the upper edge in FIG. 1) and projects into housing 11d of the upper case 11. On the other hand, one end of bus bar 15 of branch circuit module 30 bends upwardly, forming connecting terminal portion 15a. Connecting terminal portion 15a projects into the housing 11d and is superimposed with and welded to the bus bar 20.

Figure 5A:
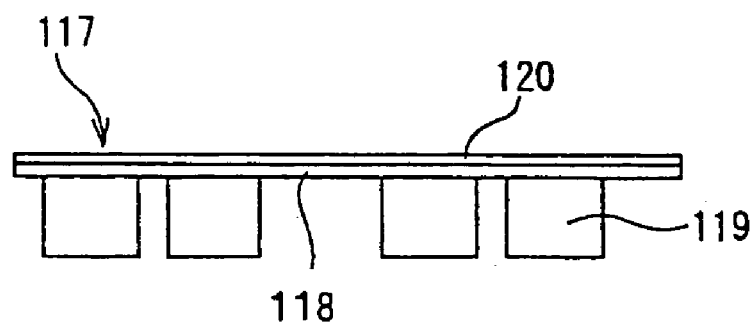
FIG. 5A is a lateral view of the circuit construct for gasoline engines, according to an aspect of the present invention.
Figure 5B:
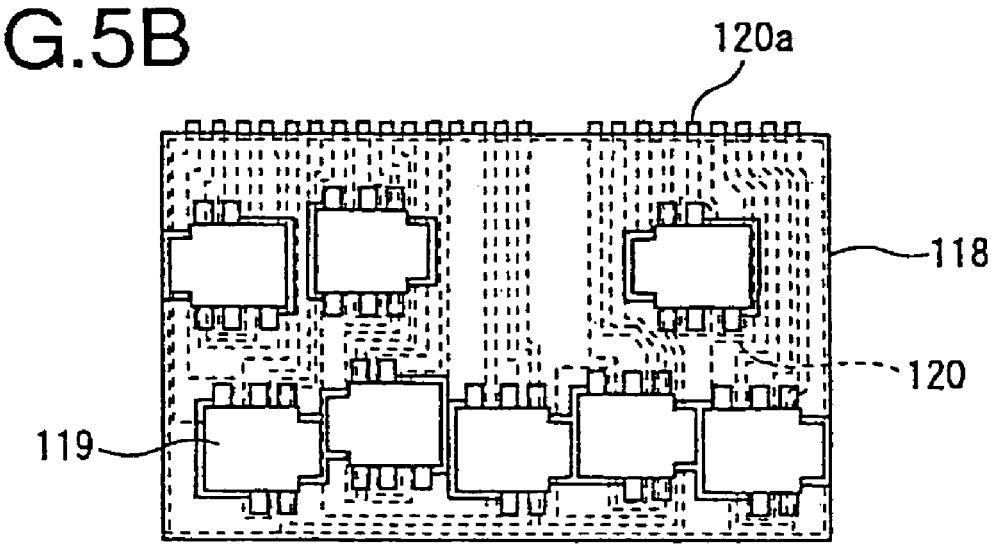
FIG. 5B a top view of the circuit construct for diesel engines, according to an aspect of the present invention.

As shown in FIGS. 5A and 5B, the circuit construct 117 for diesel engines is the same as circuit construct 17 for gasoline engines in that circuit construct 117 for diesel engines has relays (for example, SMD relays) 119 mounted on one side of printed circuit board 118 and bus bar 120 fixed on the other side of printed circuit board 118. Terminal portion 120a on one side of bus bar 120 extends upwardly beyond the edge of the printed circuit board 118. Circuit construct 117 for diesel engines is different from circuit construct 17 for gasoline engines in that the circuit pattern of bus bar 120 and the number of relays 119 mounted are different.

Figure 6A:
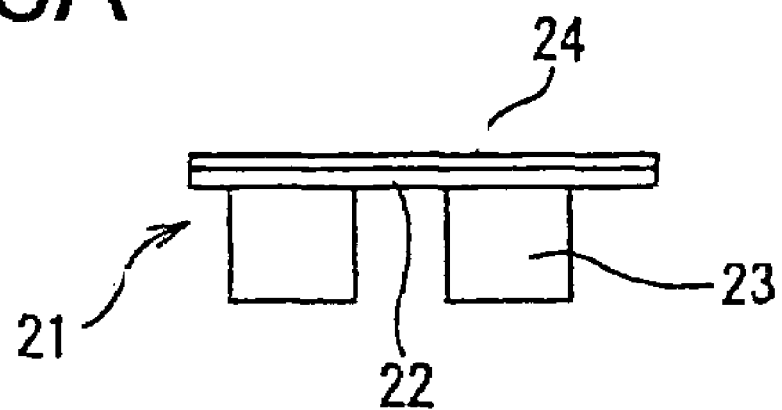
FIG. 6A is a lateral view of the circuit construct for the alternator side connection, according to an aspect of the present invention.
Figure 6B:
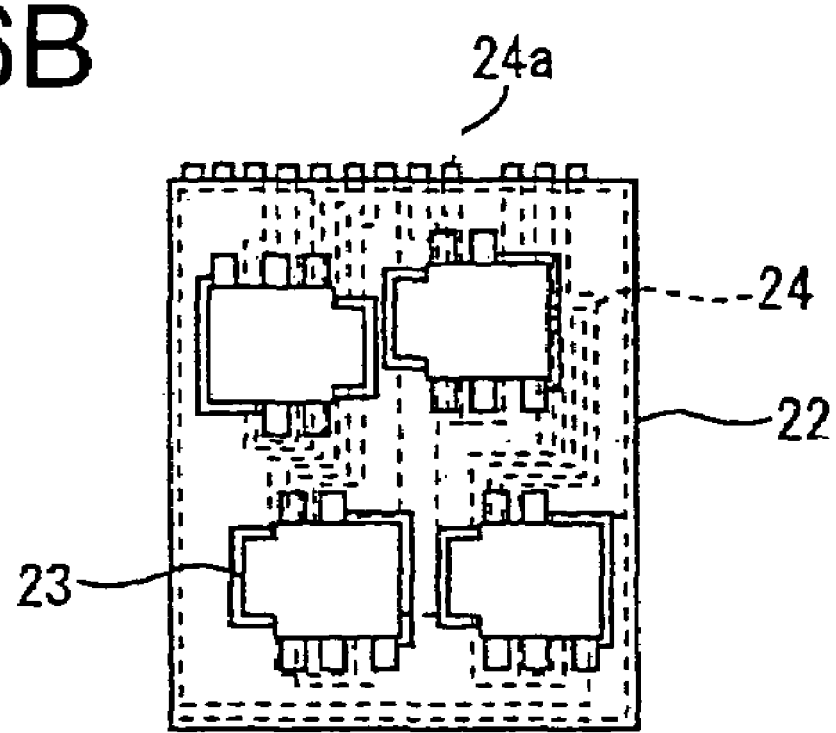
FIG. 6B is a top view of the circuit construct for the alternator side connection, according to an aspect of the present invention.

Circuit construct 21 for the alternator side connection is common to all vehicle families and grades. As shown in FIGS. 6A 6B, relays 23 are mounted on one side of circuit board 22 and bus bar 24 is fixed on the other side of circuit board 22. Terminals of relays 23 and bus bar 24 are electrically connected. As in the case of the circuit construct 17 for gasoline engines, connecting terminal portion 24a of bus bar 24 of circuit construct 21 also projects beyond the edge of circuit board 22 and is connected with bus bar 15 of laminate 13.

Figure 7A:
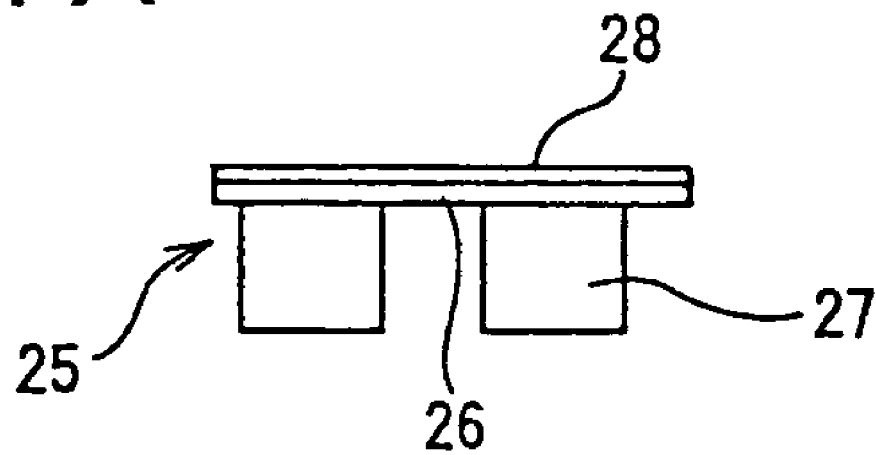
FIG. 7A is a lateral view of an optional circuit construct, according to an aspect of the present invention.
Figure 7B:
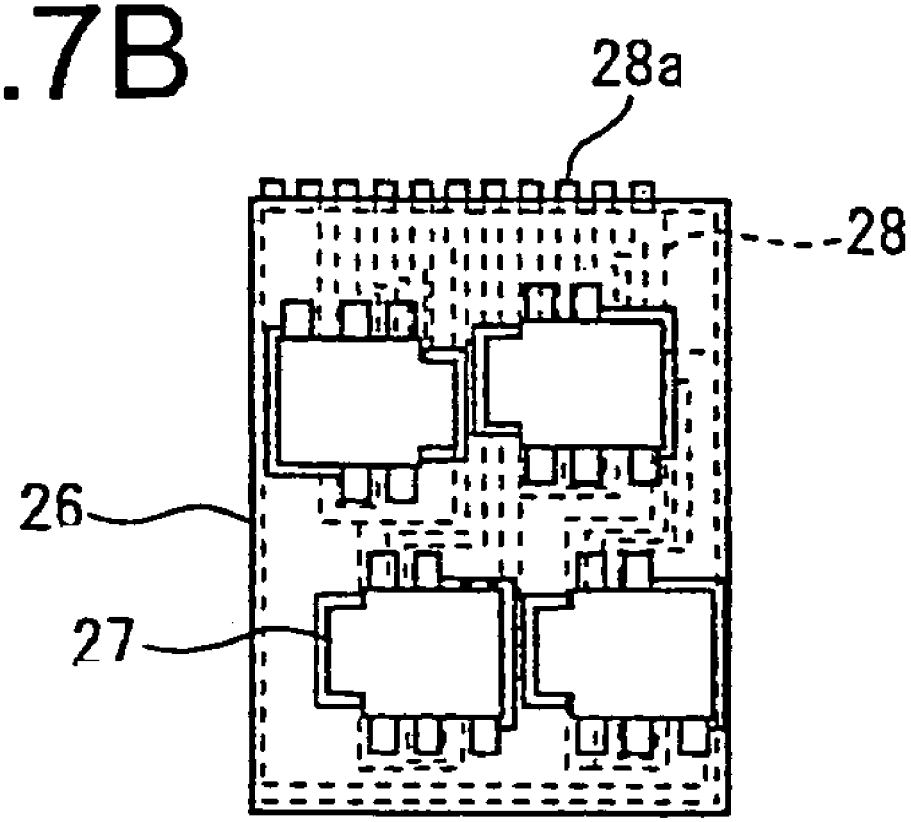
FIG. 7B a top view of the optional circuit construct, according to an aspect of the present invention.

Optional circuit construct 25 is used as an additional component for a high grade vehicle. As shown in FIGS. 7A and 7B, relays 27 are mounted on one side of circuit board 26 and bus bar 28 is fixed on the other side of circuit board 26. Terminals of relays 27 and bus bar 28 are electrically connected. Connecting terminal portion 28a of bus bar 28 also projects beyond the edge of circuit board 26 and is connected with bus bar 15 of laminate 13.

As shown in FIG. 3, the circuit construct 17 for gasoline engines, circuit construct 21 for the alternator side connection and optional circuit construct 25 are positioned side by side on one side of heat sink 29 and integrated together with heat sink 29 through an insulation sheet (not shown in the figure), in which heat sink 29 is a single piece. It is also possible to have a configuration in which a separate heat sink is attached to each of the divided circuit constructs 17, 21 and 25. In addition, in the place of the insulation sheet, it is also possible to apply a layer of adhesive material.

As described above, the circuit construct 14, which is a combination of a plurality of PDs, is placed inside PD housing 12a of lower case 12, with heat sink 29 exposed to opening 12c. Connecting terminal portions 20a, 24a and 28a, which extend upwardly in FIG. 1 from the ends of bus bars 20, 24 and 28 respectively, project into housing 11d of upper case 11. Connecting terminal portion 15a of bus bar 15 of laminate 13 also projects into housing 11d. Terminal portions 20a, 24a and 28a of the bus bars on the circuit construct 14 side and terminal portion 15a of the bus bar on the laminate 13 side are connected by welding.

As described above, circuit connection between the bus bars of circuit construct 14 of PD 31 and the bus bar of laminate 13 of branch circuit module 30 is implemented by welding. Thus, it is not a configuration in which bus bars are connected by insulation displacement connection. Consequently, it is not necessary to form insulation displacement connection tabs on terminal portions 20a, 24a and 28a of the bus bars on the circuit construct 14 side so that bus bars 20, 24 and 28 are not required to be elastic. Therefore, in the present embodiment, bus bars 20, 24 and 28 of circuit construct 14 are made of oxygen-free copper (C1020), of which the electrical and thermal conductivities are high. It is also possible to use inexpensive brass, when the cost aspect is more important.

Further, since laminate 13 of branch circuit module 30 can be utilized for making electrical connections and splices between the divided circuit constructs 17, 21 and 25, circuits on the PD 31 side can be simplified.

In electric junction box 10 having a configuration as described above, circuit construct 14 is not formed as a large single-piece structure, but is divided into circuit constructs 17, 117 for the battery side connection, circuit construct 21 for the alternator side connection, and optional circuit construct 25. Therefore, it is sufficient to design only the circuit construct that has a circuit change when a vehicle family or grade is different, thereby reducing the design load. Further, since circuit constructs 17, 117 for the battery side connection and circuit construct 21 for the alternator side connection, which are basic standard circuit constructs, can be commoditized among different vehicle families or grades, production costs can be reduced as well.

Also, since PD 31 is placed perpendicularly along the edge on one side of branch circuit module 30 so that an overall generally L-shaped electric junction box 10 is formed, it is possible to reduce the planar installation area of electric junction box 10 when it is installed in a vehicle.

Further, since connector housing 12b can be formed in the sunken region adjacent to the relay housing on the outer surface of the lower case and a wire harness can be pulled into the sunken region to make a connector connection, the handling of the wire harness also becomes easier.

In other words, as shown in FIG. 1, when connector C, which is attached at the end of wire harness W/H, is inserted into connector housing 12b, the empty space, which is left after relay module housing 12a is formed in a protruding condition, can be used effectively to accommodate the connecting portion of wire harness W/H.

The present embodiment is explained by using a gasoline engine vehicle of a high grade as an example. In the case of a diesel engine vehicle of a standard grade, circuit construct 117 for diesel engines and circuit construct 21 for the alternator side connection are used as a combination, and optional circuit construct 25 is not required.

Circuit construct 17 for gasoline engines (the circuit construct for the battery side connection) and circuit construct 21 for the alternator side connection, which are both basic standard circuit constructs, can be used among all gasoline engine vehicle families. Additionally, they can also be used among a plurality of vehicle grades of the same vehicle family or different vehicle families of the same grade. Further, in circuit construct 14 of the present embodiment, terminals of the relays on the circuit board are connected to the bus bars. The terminals of the relays can also be connected to printed conductors.

In the following paragraphs, the second and the third embodiments regarding the heat sink attached to the circuit construct will be explained.

Figure 8:
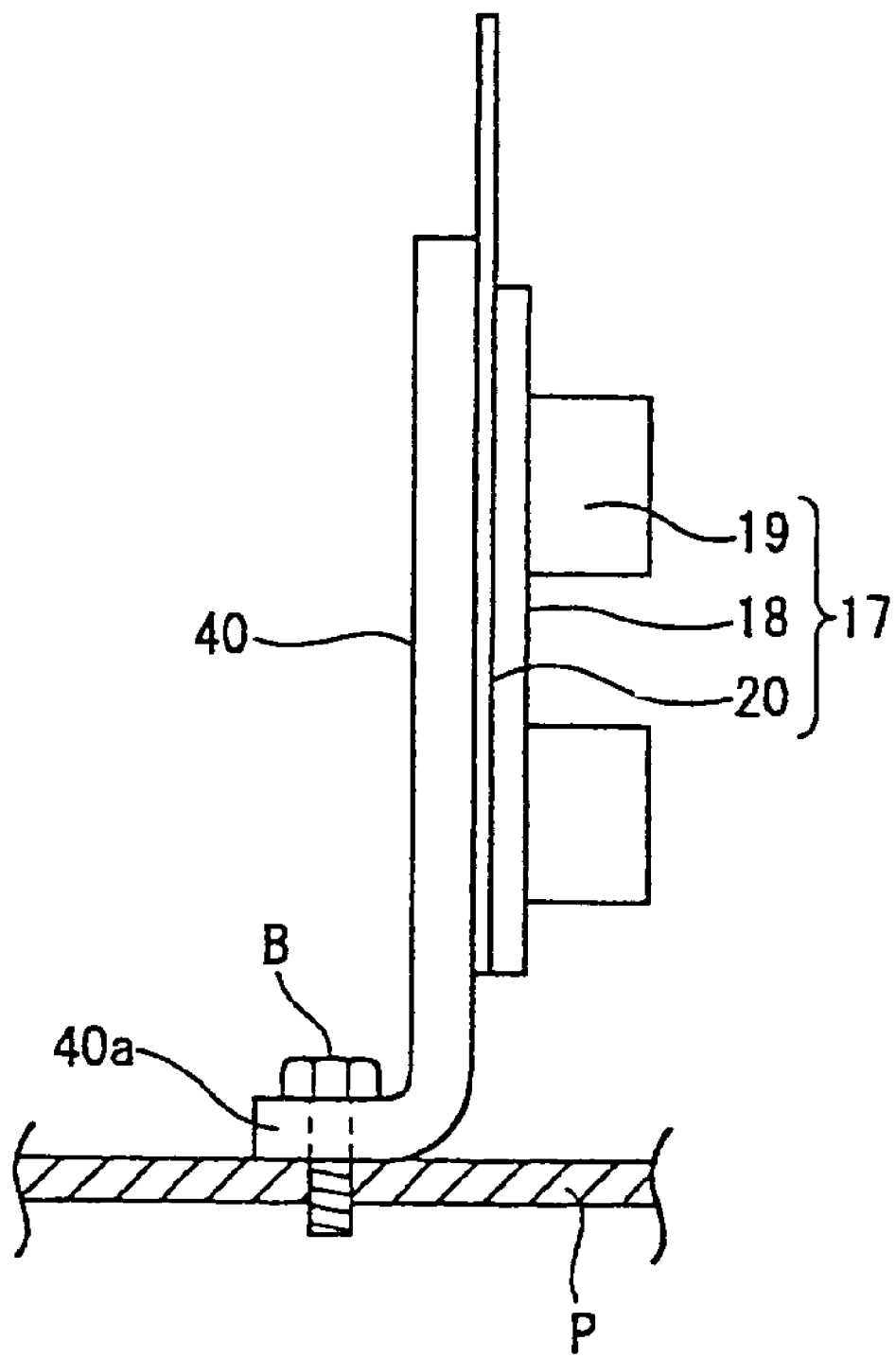
FIG. 8 is a lateral view of a heat sink and circuit construct, according to a second embodiment of the present invention.

FIG. 8 illustrates the second embodiment of the present invention. Heat sink 40 is attached to bus bar 20. The heat sink 40 is bent into L-shape and bus bar 20 is fixed on the back-side of circuit board 18 of circuit construct 17. The bending terminal portion 40a of heat sink 40 is fastened on vehicle body panel P by bolt B. Heat generated at relays 19 is released by heat conduction through bus bar 20 and heat sink 40 to vehicle body panel P.

Figure 9:
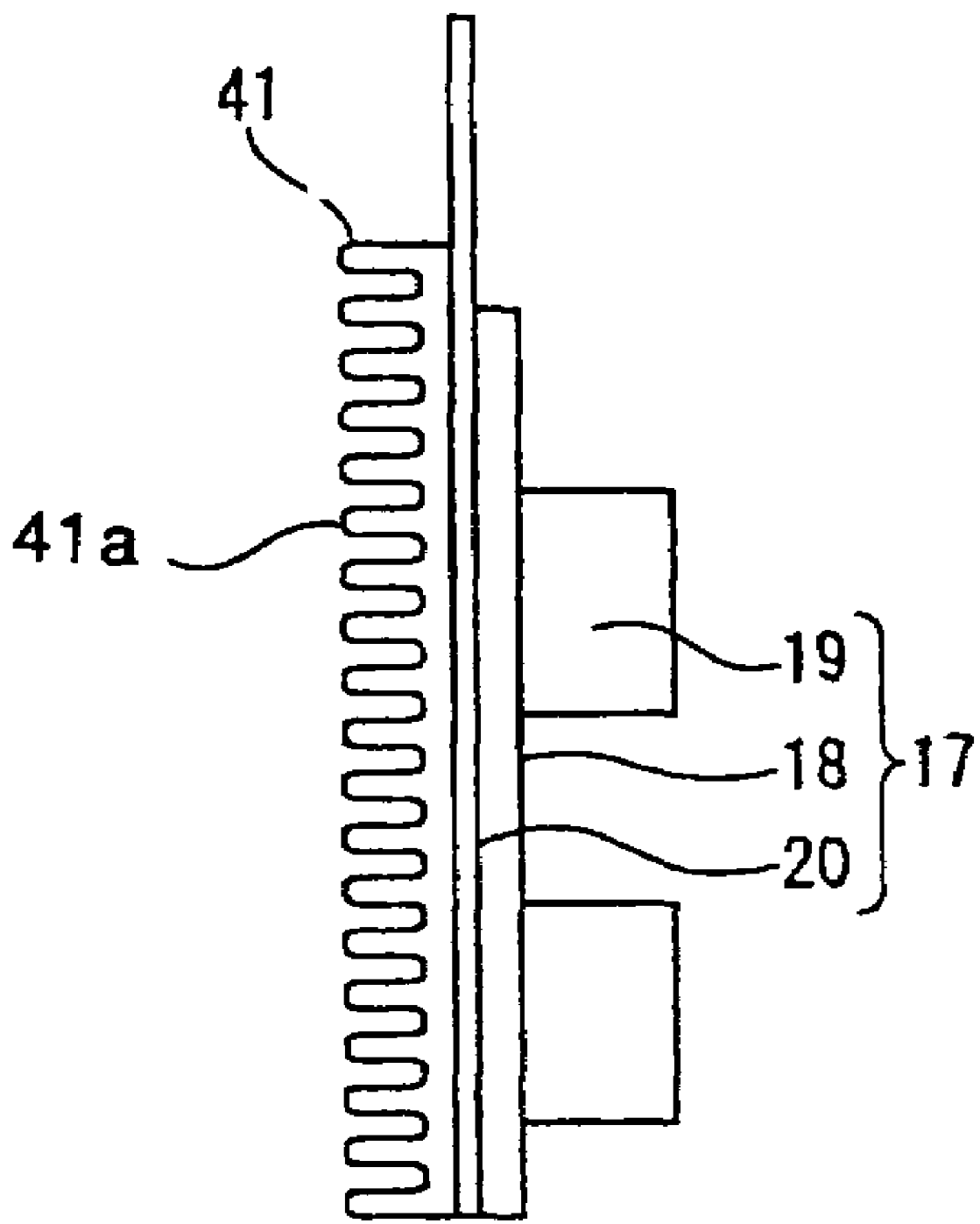
FIG. 9 is a lateral view of a heat sink and circuit construct, according to a third embodiment of the present invention.
Figure 10:
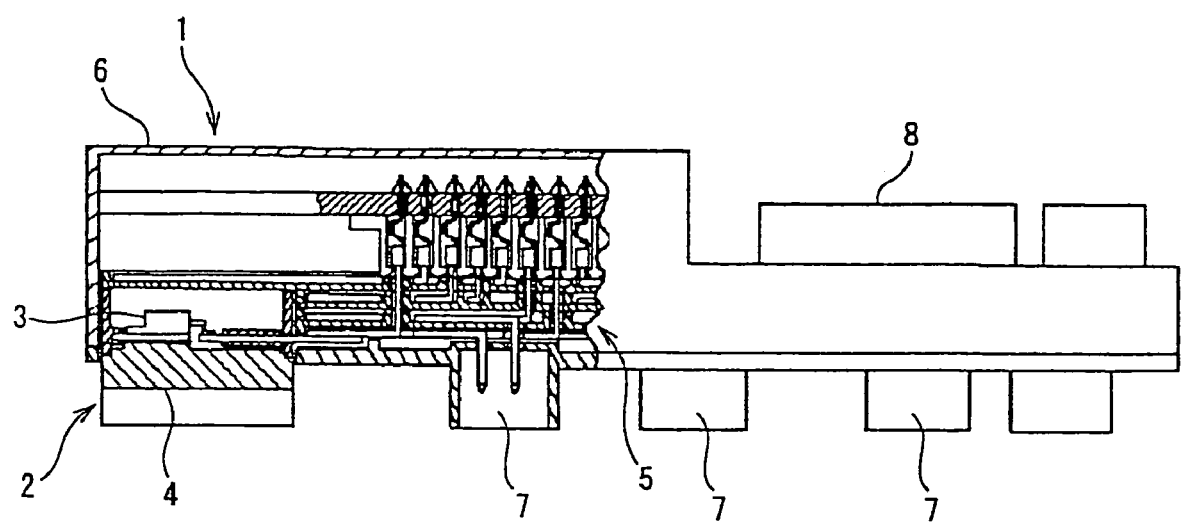
FIG. 10 shows an example of a conventional electric junction box.

FIG. 9 illustrates the third embodiment of the present invention. Heat sink 41 is attached to bus bar 20. Heat sink 41 includes a large number of fins 41a and bus bar 20 is fixed on the back-side of circuit board 18 of circuit construct 17. When heat sink 41 is used, the surface area is enlarged because of fins 41a, thereby making it possible to enhance the heat radiation efficiency of the heat sink, as heat is generated at relays 19.

The present disclosure relates to subject matter contained in priority Japanese Application No. 2004-242029, filed on Aug. 23, 2004, which is herein expressly incorporated by reference in its entirety.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

What is claimed is:

1. An electric junction box for installation in an automobile, comprising:
a circuit construct comprising an internal circuit component of said electric junction box,
said circuit construct including relays mounted on a first side of a printed circuit board and bus bars fixed on a second side of said printed circuit board,
said circuit construct comprising a standard circuit construct and an optional circuit construct, said standard circuit construct configured to be installed in said automobile, regardless of make or model of said automobile, and,
wherein a plurality of said circuit constructs are positioned adjacently, and a heat sink is attached on a side of said plurality of said circuit constructs having said bus bars, thereby forming a power distributor, and
wherein said heat sink is attached as to face an opening provided in a case of said electric junction box.

2. The electric junction box according to claim 1, wherein said standard circuit construct comprises a circuit construct for a battery side connection and a circuit construct for an alternator side connection, and wherein said electric junction box is configured to selectively receive said circuit construct for said battery side connection in a vehicle having a gasoline engine or in a vehicle having a diesel engine.

3. An electric junction box, comprising:
a power distributor comprising a circuit construct having circuit board mounting relays mounted on a first side of a printed circuit board and bus bars mounted on a second side of said printed circuit board, having a heat sink attached on a side of said circuit construct having said bus bars, said heat sink facing an opening provided in a case of said power distributor;
a branch circuit module comprising a laminate of bus bars and insulation plates, and including housings for relays, fuses and connectors, the relays, fuses and connectors being connected to said bus bars, the laminate being provided inside said case, and said housings being provided on a side of said case,
wherein said power distributor is arranged perpendicularly to said branch circuit module along an edge on a side of said branch circuit module, forming a generally L-shaped configuration, and
wherein terminal portions of said bus bars of said branch circuit module, provided at a corner of said generally L-shaped configuration, are welded to said terminal portions of said bus bars of said circuit construct, said bus bars of said circuit construct being provided perpendicularly to said bus bars of said branch circuit module.

4. The electric junction box according to claim 3, wherein said circuit construct comprises a standard circuit construct and an optional circuit construct, said standard circuit construct configured to be installed in an automobile, regardless of make or model of said automobile.

5. The electric junction box according to claim 4, wherein said standard circuit construct comprises a circuit construct for a battery side connection and a circuit construct for an alternator side connection, and wherein said electric junction box is configured to selectively receive said circuit construct for said battery side connection in a vehicle having a gasoline engine or in a vehicle having a diesel engine.

6. The electric junction box according to claim 3, wherein a connector housing is provided on a first side of said branch circuit module and a relay housing and a fuse housing are provided on a second side of said branch circuit module.

7. The electric junction box according to claim 4, wherein a connector housing is provided on a first side of said branch circuit module and a relay housing and a fuse housing are provided on a second side of said branch circuit module.

8. The electric junction box according to claim 5, wherein a connector housing is provided on a first side of said branch circuit module and a relay housing and a fuse housing are provided on a second side of said branch circuit module.

9. An electric junction box, comprising:
a power distributor comprising a circuit component having a printed circuit board, at least one relay provided on a first side of said printed circuit board, at least one bus bar provided on a second side of said printed circuit board, and a heat sink provided opposite an opening in a case of said power distributor; and
a branch circuit module comprising a laminate of bus bars and insulation plates, said branch circuit module including a plurality of housings for electrical components, said power distributor and said branch circuit module forming a generally L-shaped configuration,
wherein said bus bars of said branch circuit module include terminal portions connected to terminal portions of said at least one bus bar of said circuit component; and
wherein said bus bars of said branch circuit module are generally perpendicular to said bus bar of said circuit component.

10. The electric junction box according to claim 9, wherein said circuit component further comprises a first circuit component for a battery side connection and a second circuit component for an alternator side connection.

11. The electric junction box according to claim 10, wherein said electric junction box is configured to selectively receive said first circuit component for said battery side connection in a vehicle having a gasoline engine or in a vehicle having a diesel engine.

12. The electric junction box according to claim 9, wherein a connector housing is provided on a first side of said branch circuit module and a relay housing and a fuse housing are provided on a second side of said branch circuit module.

13. The electric junction box according to claim 10, wherein a connector housing is provided on a first side of said branch circuit module and a relay housing and a fuse housing are provided on a second side of said branch circuit module.

14. The electric junction box according to claim 11, wherein a connector housing is provided on a first side of said branch circuit module and a relay housing and a fuse housing are provided on a second side of said branch circuit module.

* * * * *